(12) United States Patent
Tamaddoni-Jahromi et al.

(10) Patent No.: US 7,762,309 B2
(45) Date of Patent: Jul. 27, 2010

(54) INTEGRAL SINGLE CRYSTAL/COLUMNAR GRAINED COMPONENT AND METHOD OF CASTING THE SAME

(75) Inventors: Kenneth M. Tamaddoni-Jahromi, Carmel, IN (US); David W. Hunt, Orlando, FL (US)

(73) Assignee: Siemens Energy, Inc., Orlando, FL (US)

( * ) Notice: Subject to any disclaimer, the term of this patent is extended or adjusted under 35 U.S.C. 154(b) by 410 days.

(21) Appl. No.: 11/859,899

(22) Filed: Sep. 24, 2007

(65) Prior Publication Data
US 2009/0078390 A1   Mar. 26, 2009

(51) Int. Cl.
*B22D 27/04* (2006.01)
(52) U.S. Cl. ............... 164/122.1; 164/122.2; 164/338.1
(58) Field of Classification Search ............... 164/122.1, 164/122.2, 338.1
See application file for complete search history.

(56) References Cited

U.S. PATENT DOCUMENTS

| 4,464,094 A | 8/1984 | Gerken |
| 4,813,470 A | 3/1989 | Chiang |
| 5,273,708 A | 12/1993 | Freeman |
| 6,568,456 B1 | 5/2003 | Femihough |
| 2005/0022959 A1 | 2/2005 | Soderstrom et al. |
| 2005/0205002 A1 | 9/2005 | Jennings et al. |
| 2005/0211408 A1 | 9/2005 | Bullied et al. |

FOREIGN PATENT DOCUMENTS

EP   0637476 A1   2/1995

*Primary Examiner*—Kuang Lin

(57) ABSTRACT

A hybrid cast component (10) including both a columnar grained region (12) and a single crystal region (14) integrally formed and joined along a metallurgical boundary (32) in a single casting operation without the need for any weld or braze. A gas turbine blade formed as such may include a columnar grained airfoil and a single crystal platform without any necessity for a thermally formed joint at the blade fillet area.

7 Claims, 1 Drawing Sheet

INTEGRAL SINGLE CRYSTAL/COLUMNAR GRAINED COMPONENT AND METHOD OF CASTING THE SAME

FIELD OF THE INVENTION

This invention relates generally to the field of materials technology, and more particularly to a cast superalloy component and a method of producing the same.

BACKGROUND OF THE INVENTION

Gas turbine engine components such as rotating blades and stationary vanes are subjected to high temperatures and stresses for extended periods of time. Additionally, there are high thermally induced stresses and strains associated with the cycling of a turbine engine between shutdown and power operating conditions. Materials with a low elastic modulus are preferred for minimizing the thermal stresses associated with engine cycling, thereby providing extended component life.

Cast columnar grained and single crystal materials have been developed to take advantage of high creep strength along the growth axis (001) of the material. These materials also exhibit crystallographic anisotropy. Columnar grained materials have one lowest modulus orientation; i.e. longitudinal, aligned with (001). Single crystal materials possess cubic symmetry and thus have three lowest modulus orientations—(001), (010) and (100). Thus, gas turbine components are ideally manufactured as single crystals wherein the grain orientation is controlled within the component to align the low modulus directions with the axes of highest thermal strains. However, there are many manufacturing challenges in growing a single crystal in the form of a complex turbine component, and therefore complex castings are usually of low casting yield and thus are very costly. Columnar grained materials are a compromise between the properties of equiaxed (random grained) and single crystal materials. While these materials provide optimum mechanical properties in only one direction, they present fewer manufacturing challenges and are generally of higher casting yield and lower cost than single crystal materials, and they are therefore preferred for certain gas turbine applications.

U.S. Pat. No. 4,464,094 describes a gas turbine engine vane incorporating an airfoil made of a columnar grained material and shrouds made of a single crystal material. The airfoil and shroud components are separately cast superalloy materials that are subsequently joined by welding. The resulting vane component exhibits material orientations that are advantageous relative to the direction of peak stresses in the component, and it exposes a minimum number of grain ends to hot combustion gasses during operation of the turbine component. Proper spatial orientation of the shrouds and airfoil is ensured by the use of temporary spacer bars to interconnect the opposed shrouds during welding of the airfoil to the shrouds. While the resulting product may be preferred over previous designs utilizing only columnar grained materials, the cost of manufacturing and the risk of fabrication defects are increased by the necessary welding operation.

BRIEF DESCRIPTION OF THE DRAWINGS

The invention is explained in the following description in view of the drawings that show.

DETAILED DESCRIPTION OF THE INVENTION

The present inventors have innovatively developed a casting process that provides a hybrid component formed of a single casting of a material having both a columnar grained region and a single crystal region without any need for a braze or weldment between the columnar grained and single crystal regions. The resulting hybrid component may advantageously be formed to take advantage of the optimum mechanical properties of a columnar grained superalloy material along its (001) primary stress axis, and simultaneously to take advantage of the low modulus (010) and (100) orientations of a single crystal of the same superalloy material, without the necessity for a costly and potentially flaw-inducing metals joining operation.

Figure 1:
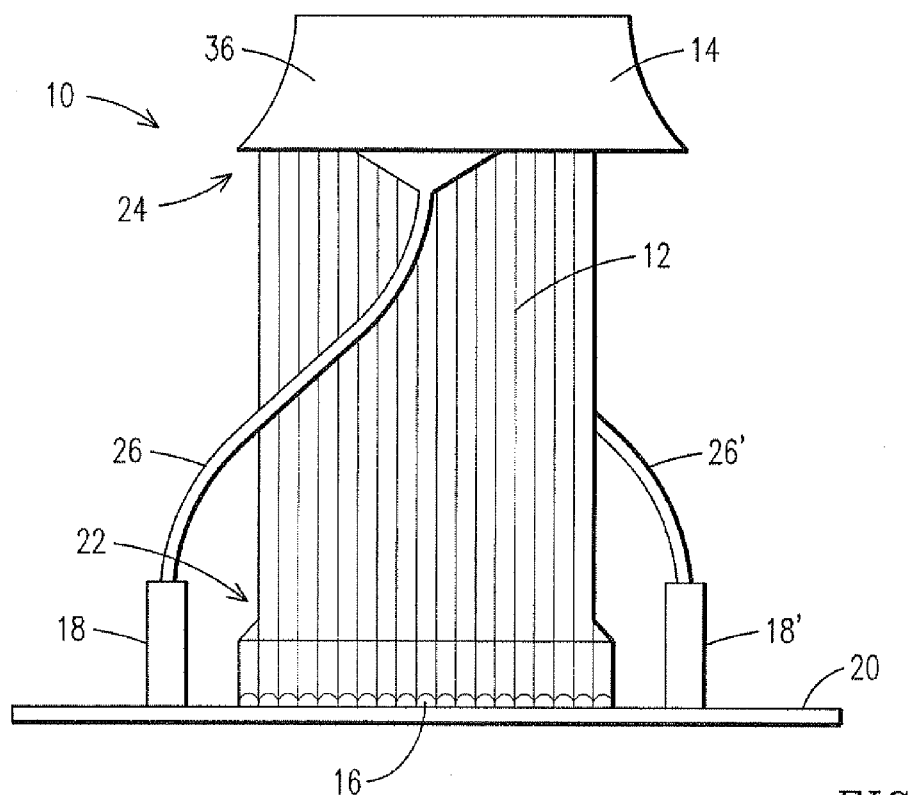
FIG. 1 is a schematic representation of the casting of a gas turbine blade to have a columnar grained airfoil section and a single crystal platform section and the mold configuration required to produce this geometry.

FIG. 1 is a schematic illustration of one embodiment of the present invention wherein a gas turbine component such as a blade 10 is manufactured using an investment casting process in a single casting operation within a directional solidification furnace to include both a columnar grained airfoil section 12 and a single crystal platform section 14 formed of the same superalloy material. FIG. 1 is drawn to show the cast metal component and important components of the casting apparatus. However, the investment mold and wax pattern used to form such a mold are not illustrated in order to better reveal aspects of the invention; however, one skilled in the art will appreciate the location and operation of such structures when used in combination with or as part of the present invention.

To produce a conventional columnar grained component, a starter block is incorporated onto a wax pattern to nucleate a series of grains that are then allowed to competitively grow in the (001) orientation. To produce a conventional single crystal component, a grain selector or seed grain is incorporated onto a wax patter to nucleate and/or to allow only one grain to grow into the component in the (001) direction.

To manufacture the hybrid component 10 of FIG. 1, both a columnar grain starter block 16 and a single crystal starter seed grain 18 are incorporated onto the wax pattern proximate the location of a chill plate 20 to create the desired structures in the desired locations during a single casting operation. In the illustrated hybrid gas turbine blade 10 application, the component may include a columnar grained airfoil 12 with a single crystal platform 14. The hybrid turbine blade columnar grained airfoil 12 takes advantage of the high creep strength along the (001) primary stress axis parallel to a radial length direction of the airfoil 12, as illustrated. The hybrid platform 14 takes advantage of the low modulus (010) and (100) orientations aligned with the axes of highest thermal strains in the platform, generally perpendicular to the airfoil section radial length direction. The columnar grained starter block 16 is incorporated between the wax pattern airfoil section 12 and chill plate 20, and the single crystal seed starter 18 is incorporated between the wax pattern platform section 14 and the chill plate 20.

In the embodiment of FIG. 1, the columnar grained material is grown from a bottom region 22 of the component shape proximate the chill plate 20 toward a top region 24 of the component shape. A grain continuator 26 may have an inlet end receiving the single crystal nucleated by the single crystal seed 18 and an outlet end disposed at the top region 24 of the component shape to direct growth of the single crystal material to avoid the bottom region 22 and into only the top region 24 of the component shape.

Figure 2:
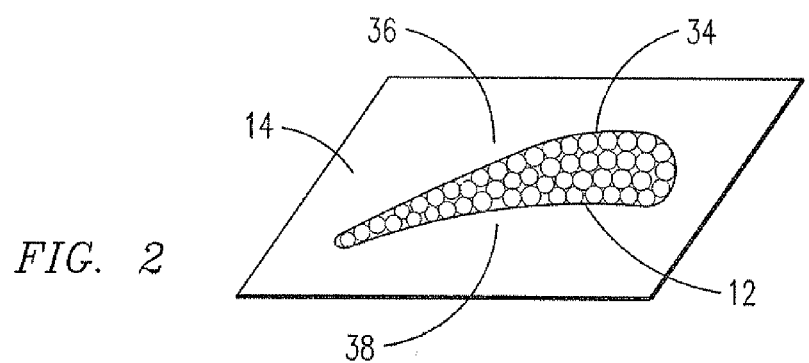
FIG. 2 is a top view of a gas turbine blade cast as shown in FIG. 1.
Figure 3:
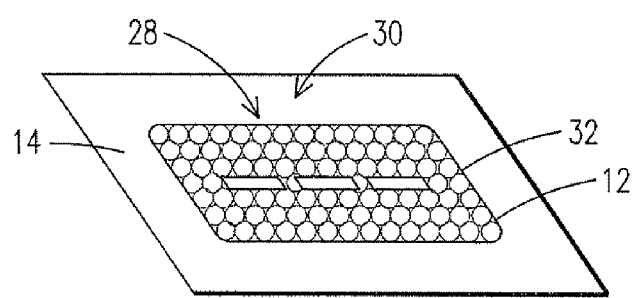
FIG. 3 is a bottom view of the gas turbine blade of FIG. 2.

Once molten metal is introduced into the mold, solidification of the molten metal is controlled within the mold to grow a columnar grained material 12 from the columnar grained starter block 16 into a first region of the component shape (airfoil illustrated) and to grow a single crystal material 14 from the single crystal starter block 18 into a second region of the component shape (platform illustrated). The columnar grains may extend through a central region 28 of the platform section 14 and the single crystal is formed around the central region 28 to define a perimeter shape 30 of the platform section 14. The columnar grained material 12 and the single crystal material 14 will thus become integrally joined along a metallurgical boundary 32 (as shown in FIG. 3) during the solidification step without the necessity for a separate metals joining step, as would be needed in the prior art process of U.S. Pat. No. 4,464,094. The boundary 32 may include the blade fillet region 34 (as shown in FIG. 2) which is known to be a stress concentrating region of a gas turbine blade and would be the location of a stress inducing thermal joint (weld or braze) in the prior art blade of U.S. Pat. No. 4,464,094. Thus, a gas turbine blade 10 of the present invention is expected to have improved mechanical properties compared to its prior art counterpart in this critical area.

In some embodiments of the present invention more than one columnar grained region and/or more than one single crystal region may be created to form the component shape. FIG. 1 illustrates the use of two grain continuators 26, 26' between respective single crystal starter blocks 18, 18' and respective opposed front 36 and back 38 sides of the platform 14. In this arrangement, the platform 14 may be formed of two single crystal grains that will be metallurgically joined along a low angle boundary, again without the need for any metals joining step.

While various embodiments of the present invention have been shown and described herein, it will be obvious that such embodiments are provided by way of example only. Numerous variations, changes and substitutions may be made without departing from the invention herein. For example, a gas turbine vane may be formed in accordance with the invention to have a single crystal airfoil and a columnar grained platform. Accordingly, it is intended that the invention be limited only by the spirit and scope of the appended claims.

The invention claimed is:

1. A method of casting comprising:
providing a mold defining a component shape comprising a first region and a second region;
providing a chill plate;
providing a columnar grained starter block between the chill plate and the first region;
providing a single crystal starter seed between the chill plate and the second region;
introducing molten metal into the mold; and
controlling solidification of the molten metal within the mold to grow a columnar grained material from the columnar grained starter block into the first region and to grow a single crystal material from the single crystal starter seed into the second region, with the columnar grained material and the single crystal material being integrally joined along a boundary during the solidification step without the necessity for a separate metals joining step.

2. The method of claim 1, further comprising disposing a grain continuator between the single crystal starter seed and the second region.

3. The method of claim 2, further comprising:
growing the columnar grained material from a bottom region of the component shape proximate the chill plate toward a top region of the component shape; and
locating an outlet end of the grain continuator at the top region of the component shape to direct growth of the single crystal material to avoid the bottom region of the component shape and into only the top region of the component shape.

4. The method of claim 1 further comprising:
forming the mold so that the first region defines an airfoil shape and the second region defines a platform shape; and
controlling solidification of the molten metal within the mold to grow the columnar grained material to form an airfoil and to grow the single crystal material to form a platform, with the columnar grained airfoil and the single crystal platform being integrally joined along a boundary comprising a fillet region.

5. The method of claim 4, further comprising:
disposing two grain continuators between respective single crystal starter seeds and opposed sides of the second region; and
controlling solidification of the molten metal within the mold to grow the columnar grained material to form the airfoil and to grow single crystal material from a first of the single crystal starter seeds to form a front side of the platform and to grow single crystal material from a second of the single crystal starter seeds to form a back side of the platform.

6. A casting apparatus comprising:
a chill plate;
a mold extending from the chill plate and comprising a first region proximate the chill plate and a second region remote from the chill plate;
a columnar grained starter block disposed between the chill plate and the first region of the mold;
a single crystal starter seed disposed proximate the chill plate but remote from the columnar grained starter block;
a grain continuator disposed between the single crystal starter seed and the second region of the mold;
whereby when molten metal is introduced into the mold, solidification can be controlled within the mold to grow a columnar grained material from the columnar grained starter block into the first region and to grow a single crystal material from the single crystal starter seed into the second region while bypassing the first region, with the columnar grained material and the single crystal material being integrally joined during the solidification step without the necessity for a separate metals joining step.

7. The casting apparatus of claim 6, wherein the first region defines an airfoil section of a gas turbine blade and the second region defines a platform region of the blade.

* * * * *